United States Patent
Crane et al.

(10) Patent No.: US 12,100,476 B2
(45) Date of Patent: Sep. 24, 2024

(54) TEST MODE SECURITY CIRCUIT

(71) Applicant: Micron Technology, Inc., Boise, ID (US)

(72) Inventors: Kari Crane, Meridian, ID (US); Kevin G. Werhane, Kuna, ID (US); Yoshinori Fujiwara, Boise, ID (US); Jason M. Johnson, Nampa, ID (US); Takuya Tamano, Boise, ID (US); Daniel S. Miller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 194 days.

(21) Appl. No.: 17/942,944

(22) Filed: Sep. 12, 2022

(65) Prior Publication Data

US 2024/0087625 A1    Mar. 14, 2024

(51) Int. Cl.
*G11C 7/24* (2006.01)
*G11C 7/10* (2006.01)
*G11C 17/16* (2006.01)

(52) U.S. Cl.
CPC .............. *G11C 7/24* (2013.01); *G11C 7/1039* (2013.01); *G11C 7/1063* (2013.01); *G11C 17/16* (2013.01)

(58) Field of Classification Search
CPC ....... G11C 7/24; G11C 7/1039; G11C 7/1063; G11C 17/16
See application file for complete search history.

(56) References Cited

U.S. PATENT DOCUMENTS

2004/0184339 A1* 9/2004 Ozawa ................... G11C 16/22
                                                        365/230.03
2024/0038319 A1* 2/2024 Kim ....................... G11C 29/44

* cited by examiner

*Primary Examiner* — Ajay Ojha
(74) *Attorney, Agent, or Firm* — Perkins Coie LLP

(57) ABSTRACT

An apparatus includes a TM control circuit that is configured to receive address information corresponding to a TM function and compare the address information with an authorized TM list stored in a memory of the apparatus to determine if there is a match. If there is a match, a latch load signal pulse is output. A TM latch circuit programs one or more latches based on the address information and based on the latch load signal pulse. The TM latch circuit decodes information in the one or more latches and, based on the decoded information, outputs a test mode signal to turn on test mode operations in circuits associated with the TM function. The apparatus includes a plurality of TM functions for testing various features of the apparatus and the authorized TM list identifies which of the plurality of TM functions has been authorized for customer use.

20 Claims, 5 Drawing Sheets

TEST MODE SECURITY CIRCUIT

TECHNICAL FIELD

The present disclosure relates generally to semiconductor devices, and more particularly relates to test mode security schemes for semiconductor systems.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

Memory device (also referred to herein as "memory chip" or "chip") makers often include test mode (TM) functions on such memory devices to improve the reliability, productivity, quality, and yield of the memory device as well as configure the part type during production testing of the chip. Test modes are often needed to stress test and/or configure circuit blocks of the chip, including data I/O and controls, memory cell array and controls, address and command inputs and controls, etc. Allowing customers (e.g., an entity purchasing the memory device to build an apparatus including the memory device, such as an original equipment manufacturer (OEM)) to access some test modes could help such customers save costs and/or perform repairs on memory easier such as, for example, helping customers with BIOS optimization and testing code. As used herein "customer" referred to an OEM or similar entity but not an end user. However, allowing such access to test mode functions presents security risks in that a customer, end user, or hacker could access other test modes not intended for the customer or the general public.

DETAILED DESCRIPTION

Figure 1:
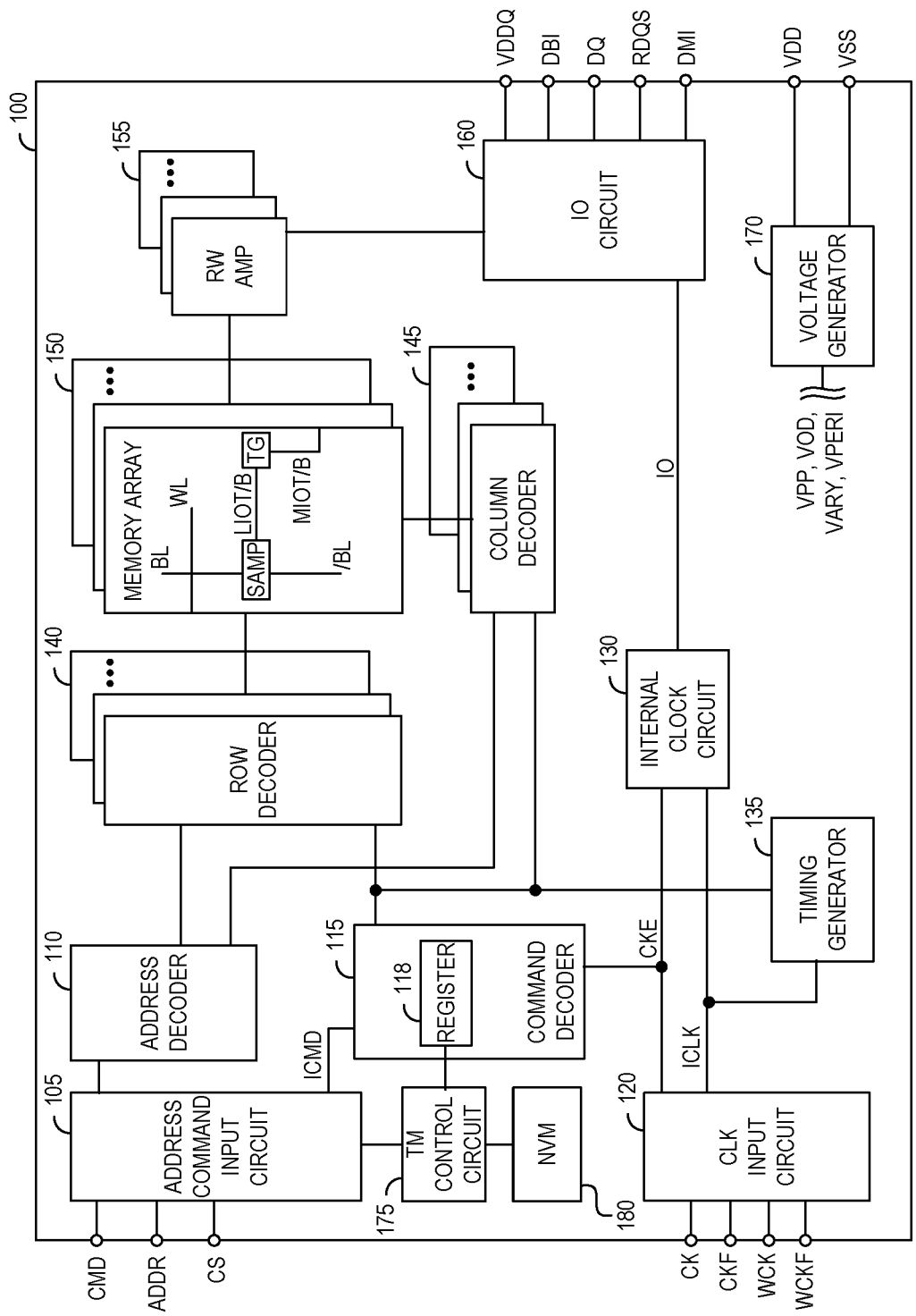
FIG. 1 is a simplified block diagram schematically illustrating a memory device in accordance with embodiments of the present technology.

Memory devices and systems associated with such devices can include a plurality of test mode ("TM") functions that are often needed to affect circuit blocks of the chip, including data I/O and controls, memory cell array and controls, address and command inputs and controls, etc. The TM functions, which can number in the hundreds or thousands, can be stored in a memory (e.g., a nonvolatile memory array) of the memory device and can be accessed by the chip manufacture during production testing of the chip. The TM functions can be used to, e.g., trim critical timings associated with functionality of a chip, stress the device to discover defects, and/or configure the part type.

In conventional or traditional memory devices, TM functions are not accessible by the chip manufacturer's customer or other downstream users (e.g., end users). This is because misuse of the TM functions can cause damage to the chip and/or the devices connected to the chip. In addition, a hacker could use the TM functions to reverse engineer at least some aspects of the memory chip. Typically, once the chip manufacturer has configured the chip, the TM functions are disabled prior to shipment by, for example, blowing a fuse on the chip. By disabling the TM functions, the customer and hacker are prevented from accessing the TM functions, even if the person knows the signal sequence code to enable test mode operation in the chip and/or the TM keys to the TM functions.

However, in some cases, a chip manufacturer may not wish to disable at least some of the TM functions to provide a trusted customer access to these TM functions. For example, an OEM may need to test and configure the chip for their specific application prior to incorporating the chips into their devices. In such cases, the chip manufacturer may not wish to disable all of TM functions. Instead. the chip manufacturer can provide access to the specific TM functions required by the customer. For example, selected codes and/or signal sequences (e.g., TM keys and/or the signal sequences) that permit the test mode to be enabled and/or permit access to the specific TM functions can be provided to the customer. However, although codes for accessing all the TM functions would typically not be provided, the customer or a hacker might still be able to derive some or all of the other TM function access codes through trial and error. This is because there is no hardwired circuit to prevent access to unauthorized TM functions. Accordingly, there is a security risk in that unauthorized TM functions could be accessed, which could result in the chip being damaged and/or reverse engineering of at least some of the chip design.

The present technology disclosed herein is an improved test mode security scheme that allows a customer access to authorized TM functions and prevents access to the remaining unauthorized TM functions. In some embodiments of the present technology, for example, an apparatus includes a TM control circuit that is configured to receive address information corresponding to a TM function to be performed in the apparatus. The TM control circuit also compares the address information corresponding to the TM function with an authorized TM list stored in a memory of the apparatus to determine if there is a match. If the comparison indicates a match, the TM control circuit outputs a latch load signal pulse. The apparatus can also include a TM latch circuit having one or more latches. The TM latch circuit is configured to program the one or more latches based on the address information corresponding to the TM function and based on the latch load signal pulse. The TM latch circuit decodes information in the one or more latches and, based on the decoded information, outputs a test mode signal to turn on test mode features in memory device circuits associated with the TM function. The apparatus includes a plurality of TM functions for testing various features of the apparatus, and the authorized TM list identifies which of the plurality of TM functions has been authorized for customer use. As explained in further detail below, such a TM security scheme can allow authorized TM functions to execute while preventing access to unauthorized TM functions.

FIG. 1 is a simplified block diagram schematically illustrating the operation of a memory device 100 in accordance with embodiments of the present technology. The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to the memory device 100, although in other embodiments, the host device may be indirectly connected to memory device (e.g., over a networked connection or through intermediary devices).

The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells (e.g., m×n memory cells) arranged at intersections of the word lines (e.g., m word lines, which may also be referred to as rows) and the bit lines (e.g., n bit lines, which may also be referred to as columns). Memory cells can include any one of a number of different memory media types, including capacitive, phase change, magnetoresistive, ferroelectric, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

Power supply potentials VDD and VSS can be supplied to an internal voltage generator circuit 170. The internal voltage generator circuit 170 can generate various internal potentials VPP, VOD, VARY, VPERI, VPOP, and the like for use by various internal components based on the power supply potentials VDD and VSS. The power supply terminal may also be supplied with power supply potential VDDQ. The power supply potential VDDQ can be supplied to the input/output circuit 160 together with the power supply potential VSS. The dedicated power supply potential VDDQ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The clock input circuit 120 can receive the external clock signals to generate internal clock signals ICLK. The internal clock signals ICLK can be supplied to an internal clock circuit 130, which can various phase and frequency controlled internal clock signal based on the received internal clock signals ICLK and a clock enable signal CKE from the command/address input circuit 105.

The command and address terminals on command/address input circuit 105 may be supplied with command signals CMD, address signals ADDR, and chip selection signals CS, from outside (e.g., a host computer, a memory controller, etc.). The command signals CMD may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The address signals ADDR supplied to the address terminals can be transferred, via a command/address input circuit 105, to an address decoder 110. The address decoder 110 can receive the address signals and supply a decoded row address signal to the row decoder 140 (which may be referred to as a row driver), and a decoded column address signal to the column decoder 145 (which may be referred to as a column driver). The address decoder 110 can also receive the bank address signal (not shown) and supply the bank address signal to both the row decoder 140 and the column decoder 145.

The command signals CMD may be provided as internal command signals ICMD to the command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address.

The command decoder 115 may further include one or more registers 118 for tracking various counts or values (e.g., counts of refresh commands received by the memory device 100 or self-refresh operations performed by the memory device 100). In some embodiments, a subset of registers 118 may be referred to as mode registers and configured to store operational parameters to provide flexibility in performing various functions, features, and modes—e.g., TM functions. That is, in some embodiments, the command decoder 115 (and/or another circuit) can generate the signals for TM function operations. In some embodiments, the command/address input circuit 105 and/or the command decoder 115 can be coupled with a TM control circuit 175 and relay commands associated with various test mode functions thereto. In some embodiments, the TM control circuit 175 can perform various TM functions (or tests) that are defined by a manufacturer of the memory device 100 (also referred to herein as "manufacturer TM functions"). For example, the TM control circuit 175 can receive information (e.g., address information) of a desired TM function to perform and then execute the desired TM function in one or more circuits of the memory device 100. One or more of the manufacturer TM functions can be stored in a memory of the memory device 100 (e.g., a nonvolatile memory (NVM) such as NVM array 180). The TM functions can include test functions such as, for example, compression functions, trim setting functions (e.g., latching trim conditions without programing fuses), read/write timing functions, fuse access functions, built-in-self-test functions, connectivity test functions, etc. For example, the TM control circuit 175 can perform a connectivity test that is designed to speed up testing of electrical continuity of pin interconnections between the memory device 100 and a host device (e.g., a memory controller). In another example, the TM control circuit 175 can perform a compression test that is designed to stress test one or more circuits in the memory device 100 by simultaneously performing multiple read and/or write operating and analyzing the results. Other manufacturer TM functions can be executed by the TM control circuit 175 in one or more circuits of the memory device 100 to test various features of the memory device 100.

The TM control circuit 175 may be coupled to one or more registers 118 (which can also be referred to as mode registers) in a command decoder 115. In some cases, the TM control circuit 175 can read the registers 118 to determine a specific test mode function to perform based on information stored in the registers 118. In other cases, the TM control circuit 175 may store information in the registers 118 such that other functional blocks in the memory device 100 may perform appropriate functions based on the information (e.g., information related to various TM functions) stored in the registers 118. The TM control circuit 175 may be coupled with NVM array 180. The NVM array 180 can include an array of one-time programmable nonvolatile memory elements such as, for example, fuses, anti-fuses, DICE circuits, switches (e.g., metal switches), blown capacitor devices, transistors with blown gate-oxide, NAND memory cells, PCM cells, magnetic memory cells, etc. The NVM array 180 may store various operational information for the memory device 100 by programming one or more nonvolatile memory elements therein, such as trim setting conditions including specific timing and/or voltage parameters, read/write clock conditions based on the read/write timing outcomes, control bits to enable or disable customer specific features or functionality, redundancy implementation information used for repairing a portion of the memory array 150, among others. Programming nonvolatile memory elements is known in the art and thus, for brevity, further discussion regarding programming fuses, switches, etc. is omitted.

Typically, manufacturer TM functions are used only by the chip manufacturer and are not accessible to a customer, an end user, etc. However, in some cases, it can be desirable to provide one or more OEMs access one or more manufacturer TM functions so that the OEM can properly test and configure the memory device 100 prior to insertion into their device. In such cases, it can also be desirable to minimize the security risk with respect to access to TM functions that have not been authorized. As discussed below, in exemplary embodiments of the present disclosure, the TM control circuit 175 can be configured such that one or more manufacturer TM functions can be accessible by a customer via a host device, a testing device, and/or some other external device while minimizing or preventing access to unauthorized TM functions. For example, as discussed below, in some embodiments, The TM control circuit 175 can access stored information (e.g., in the NVM array 180) that relates to TM functions that are authorized for customer use.

Figure 2:
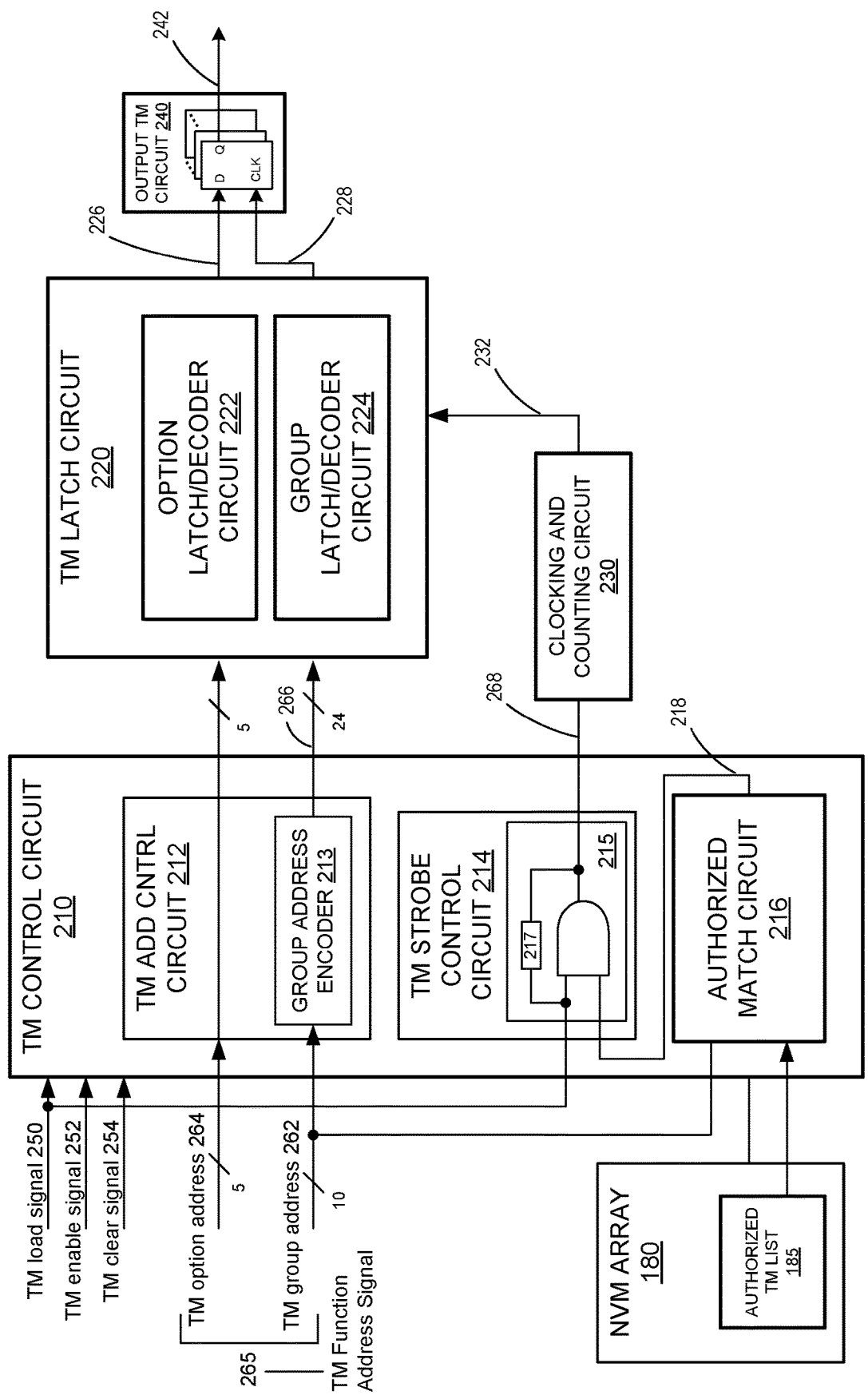
FIG. 2 is a simplified block diagram schematically illustrating a test mode control circuit in accordance with embodiments of the present technology.

FIG. 2 illustrates a TM control circuit 210 that is consistent with exemplary embodiments of the present disclosure. The TM control circuit 210 can control TM functions (or tests) during test mode operations in associated circuits of the memory device 100. TM control circuit 210 can be incorporated into memory device 100 and can include one or more functions of TM control circuit 175 and/or one or more functions of command decoder 115 and/or one or more functions of command/address input circuit 105. The TM control circuit 210 can be configured such that the manufacturer can execute manufacturer TM functions in the memory device 100 during, for example, production testing of the memory device 100. Prior to shipment to a customer, a circuit can be modified (e.g., a fuse can be blown) to prevent access to manufacturer TM functions that have not been authorized for use by the customer. However, in exemplary embodiments of the present disclosure, the customer will still be able to initiate authorized TM functions when the memory device 100 is placed in test mode. While the manufacturer has the option of creating an authorized TM list that includes all the manufacturer TM functions, it is expected that that the authorized TM list will be limited subset of the manufacturer TM list.

In some embodiments, the TM control circuit 210 can be configured to receive a TM enable signal 252 (e.g., via register 118, via command/address input circuit 105, and/or via another controller) that places the TM control circuit 210 (and other components in the memory device 100) into a test mode configuration. For example, the TM enable signal 252 can be a global enable signal that places the entire memory device 100 into a test mode configuration. During the time that TM enable signal 252 is active, normal operation of the memory device 100 may be suspended (although some test modes can permit normal operation). In some embodiments, the TM control circuit 210 can be configured to receive a TM clear signal 254 (e.g., via register 118, via command/address input circuit 105, and/or via another controller) that stops operation of the TM control circuit 210 and places the memory device 100 into a default mode of operation (e.g., a normal mode of operation).

The TM control circuit 210 can also receive a TM function address signal 265 that corresponds to a user-selected manufacturer TM function via command/address input circuit 105 (and/or another circuit). The command/address input circuit 105 (and/or another circuit) can receive the selected TM function address information from a host device, a testing device, and/or another external device. The selected TM function address signal 265 can include a TM group address portion 262 (also referred to herein as "TM group address 262") and a TM option address portion 264 (also referred to herein as "TM option address 264"). The TM control circuit 210 can further receive a TM load signal 250 (e.g., via register 118, via command/address input circuit 105, and/or via another controller) that can be, for example, a pulse signal (e.g., a logic high pulse or a logic low pulse depending on the configuration of the circuit) to load the TM function address signal 265 into the TM address control circuit 212. The TM group address portion 262 can represent a category of testing (e.g., a compression test, a continuity test, etc.) and the option address portion 264 can represent a specific test function in the group (e.g., write test function, read test function, etc. of a compression test).

The number of address bits for the TM group address portion 262 can depend on the number of test mode categories. In some exemplary embodiments, the number of bits in the TM group address portion 262 can range from 8 bits to 16 bits, but in other embodiments, the group address portion can have less than 8 bits or more than 16 bits. In the exemplary embodiment of FIG. 2, the TM group address portion 262 has 10 bits. The number of address bits for the TM option address portion 264 can depend on the number of available test functions or options for that group. In some embodiments, the number of option address bits will be the same for all groups regardless of the actual number of available test functions for that group. For example, if a compression test group requires 5 bits for its test options and a connectivity test group requires 4 bits for its options, the number of option address bits will be 5. That is, the number of option address bits for all groups will be the same and equal to that of a group having the largest number of available test functions. In some exemplary embodiments, the number of option address bits can be one or more bits such as, for example, in a range from 2 bits to 10 bits, but in some embodiments the number of option bits can be more than 10 bits. In the exemplary embodiment of FIG. 2, the TM option address portion 264 has 5 bits.

As indicated above, with the TM enable signal 252 set to enable a test mode, a pulse on the TM load signal 250 will load the TM function address signal 265 into the TM address control circuit 212. Once loaded, the TM group address portion 262 is encoded by group address encoder 213 to generate an encoded group signal 266 that includes phase data, cycle data, and sub-group data used for test mode operations in the memory device 100. Based on a global strobe clock signal 232, the TM latch circuit 220 uploads the information in the encoded group signal 266, which is now 24 bits, and programs latches in the group latch/decoder circuit 224. The global strobe clock signal 232, which can be, for example, a pulse signal, is output from the clocking and counting circuit 230. The global strobe clock signal 232 is based on the TM latch load signal 268 (e.g., a pulse signal) that is output from TM strobe control circuit 214. Once the latches in the group latch/decoder circuit 224 are programmed and enabled, the group latch/decoder circuit 224 decodes the latched information and, based on the decoded information, provides an encoded strobe clock signal 228 to the CLK input of an appropriate latch (e.g., one that corresponds to the TM group address 262 and the TM option address 264) in the output TM circuit 240. The output TM circuit 240 can include thousands of latches and each latch can provide a test mode signal to an associated circuit in the memory device 100.

In some embodiments, once the latches in the group latch/decoder circuit 224 are enabled, all the test options for the selected TM function corresponding to the TM group address 262 are also enabled for selection. That is, if the selected TM function has five options, all five options are available for selection. The selected option corresponds to the TM option address portion 264, which is loaded into the TM address control circuit 212. Once loaded, the TM option address portion 264 can be transmitted to the TM latch circuit 220. When a global strobe clock signal 232 (e.g., a pulse signal) output from the clocking and counting circuit 230 is received, the TM latch circuit 220 uploads the information in the TM option address portion 264 and programs the latches in the option latch/decoder circuit 222. Once the latches in the option latch/decoder circuit 222 are programmed and enabled, the option latch/decoder circuit 222 then decodes the latched information and, based on the decoded information, provides an option data signal 226 to the D input of an appropriate latch (e.g., one that corresponds to the TM group address 262 and the TM option address 264) in the output TM circuit 240. Based on the encoded strobe clock signal 228 and the option data signal 226, the activated latch in the output TM circuit 240 outputs a test mode signal 242 to appropriate circuits in the memory device 100 to turn on the test mode operations in those circuits.

In some embodiments, the TM strobe control circuit 214, which controls the strobe for loading the global and option address information in the TM latch circuit 220, can be configured to output a TM latch load signal 268 (e.g., a pulse) whenever the chip manufacturer initiates any manufacturer TM function during, for example, production testing of the memory device 100. However, after shipment to the customer, in some embodiments, the TM strobe control circuit 214 can be configured to output the TM latch load signal 268 only when an authorized TM function is being initiated. For example, as seen in FIG. 2, the TM strobe control circuit 214 can include a TM check circuit 215 that includes, for example, a two-input AND gate that checks if the selected TM function (e.g., function corresponding to TM group address 262) has been enabled. For example, the AND gate can receive the TM load signal 250 as one input and the other input can be a function enable signal 218 that indicates whether the selected TM function is an authorized TM function. When both the TM load signal 250 and the function enable signal 218 are set (e.g., logic high), the TM check circuit 215 sets the output TM latch load signal 268.

Prior to shipment to the customer, however, the AND gate of the TM check circuit 215 is not needed and can be bypassed (or otherwise logically removed from TM check circuit 215) such that the TM load signal 250 is output as the TM latch load signal 268 for the manufacturer-initiated testing. For example, the TM check circuit 217 can include a circuit 217 that represents a fuse latch, switch (e.g., metal switch), or other similar circuit that, during production tests by the chip manufacturer, provide a short-circuit between the TM load signal 250 input to the AND gate to bypass the AND gate. Prior to shipment of the memory device 100 to a customer, the circuit 217 can be opened (e.g., a fuse can be blown to open the latch) to introduce the AND gate to the TM check circuit 215. With the AND gate included, the manufacturer TM function tests can no longer be initiated without a function enable signal 218 set at a value (e.g., a logic high) to enable the TM function test as discussed above.

As discussed further below, the function enable signal 218 is only enabled when the TM function address signal 265 corresponds to a TM function that the chip manufacturer has authorized for execution by the customer. In some embodiments, the authorized TM functions can be identified using one or more memory elements such as, for example, switches (e.g., metal switches), latches, etc. The one or more memory elements identifying authorized TM functions are referred to herein as an "authorized TM list." In some embodiments, the one or more memory elements are a nonvolatile memory elements. For example, in some embodiments, as seen in FIG. 2, the authorized TM list can be an array of nonvolatile memory elements stored in the NVM array 180 as authorized TM list 185. The authorized TM list 185 can store the group addresses (or information corresponding to the group addresses) of authorized TM functions.

Figure 3A:
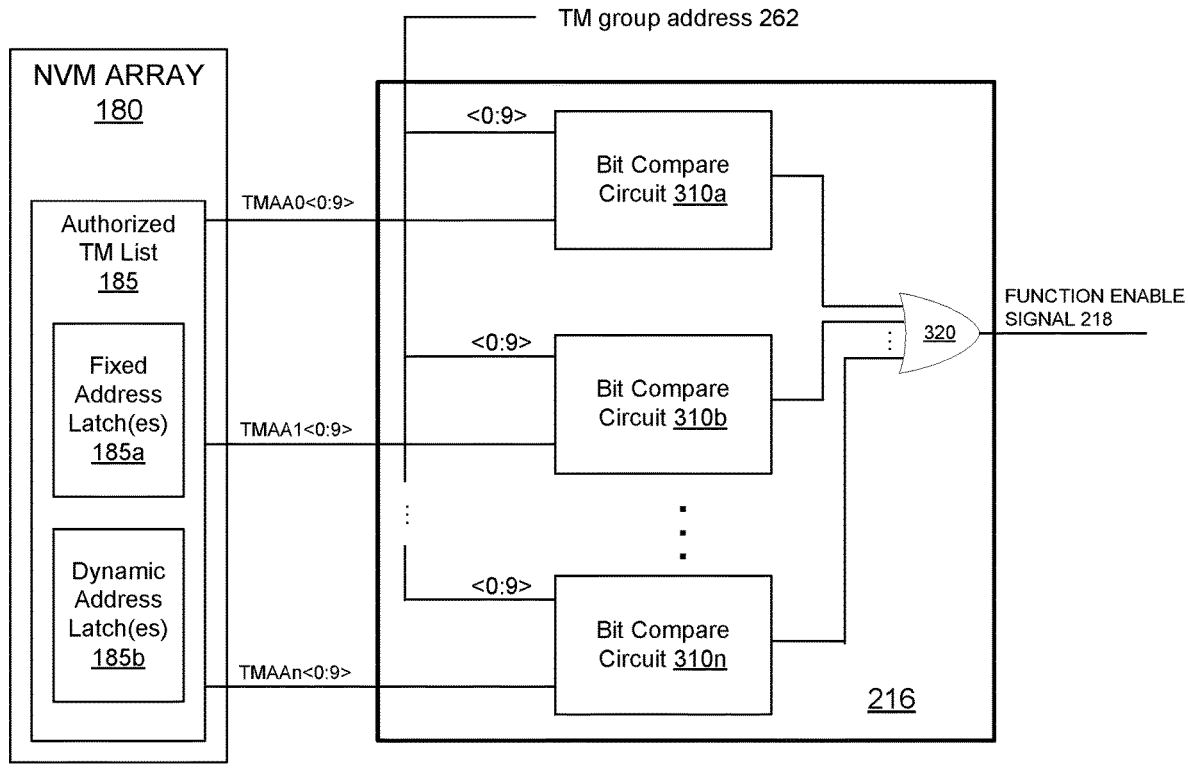
FIG. 3A is a simplified block diagram schematically illustrating a test mode compare circuit and authorized test mode list in accordance with embodiments of the present technology.

In some embodiments, the function enable signal 218 is set when the authorized match circuit 216 determines that the TM group address signal 262 matches group address information stored in the authorized TM list 185. FIG. 3A illustrates an exemplary embodiment of an authorized match circuit 216. The authorized match circuit 216 can include one or more bit compare circuits 310a-310n (collectively referred to as bit compare circuits 310). Each bit compare circuit 310 can correspond to an authorized TM function and information corresponding to the authorized TM function (e.g., group address of TM function) is provided to one input of the bit compare circuit 310. For example, the 10-bit address TMAA0<0:9> corresponding to a first authorized TM function and stored in the authorized TM list 185 in NVM array 180 can be provided to one of the inputs of bit compare circuit 310a. Similarly, the 10-bit address TMAA1<0:9> corresponding to a second authorized TM function can be provided to one of the inputs of bit compare circuit 310b—and so on until the 10-bit address TMAAn<0:9> corresponding to an n-th authorized TM function is transmitted to one of the inputs of bit compare circuit 310n. The other input of each bit compare circuits 310 can receive the TM group address 262 of the selected TM function from, for example, the host computer or tester. If there is a match between the TM group address 262 and any one of the group address TMAA0-n in the authorized TM list 185, the respective bit compare circuit 310a-n will output a match signal (e.g., logic high signal) to OR gate 320 and the output of the OR gate 320 will the set the function enable signal 218 to an enable state (e.g., to a logic high state) to indicate that the selected TM function (corresponding to the TM group address 262) is in the authorized TM list. The function enable signal 218 is then transmitted to the TM strobe control circuit 214 as discussed above. Of course, those skilled in the art recognize that other types of circuits that have the same functionality as authorized match circuit 216 and/or the TM strobe control circuit 214 can be used and that the logic states of the signals will depend on the type of circuit.

Figure 3B:
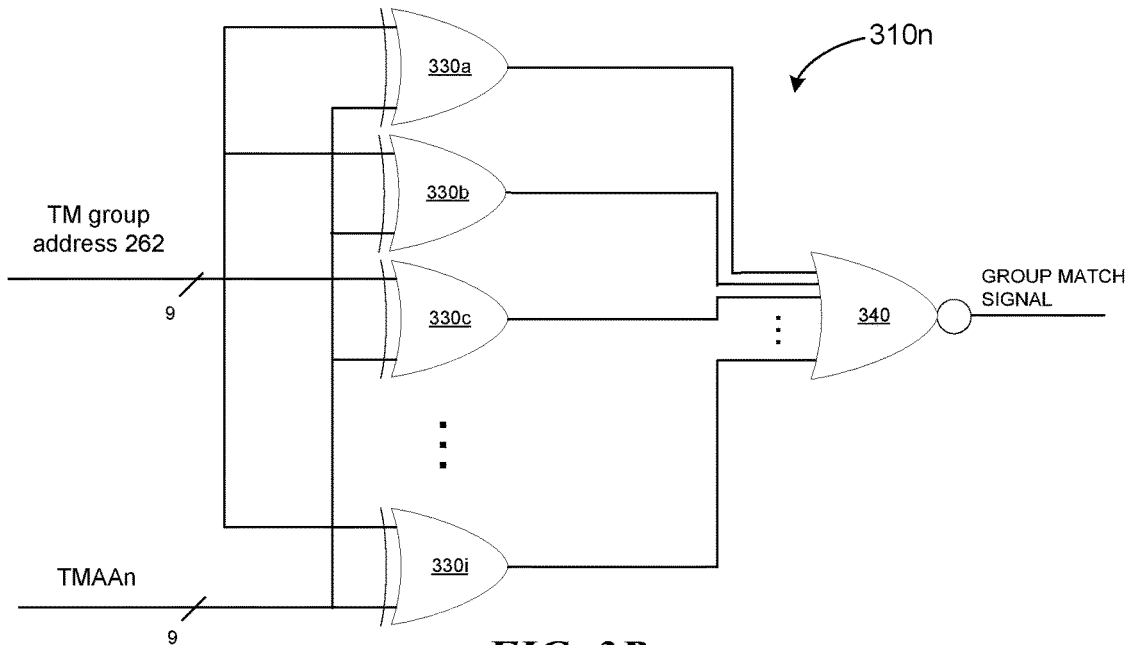
FIG. 3B is a simplified circuit diagram illustrating an exemplary bit compare circuit that can be used in the test mode compare circuit of FIG. 3A.

FIG. 3B illustrates an exemplary bit compare circuit 310n. The bit compare circuit can include an XOR gate 330a-i for each bit (e.g., 9 bits) of TM group address 262. Each bit of TM group address 262 is compared to a corresponding bit of a stored group address TMAAn of an authorized TM function. When the two bits match, the output of the XOR gate 330 is a logic low or "0." The output of each XOR gate 330a-i can be sent to a NOR gate 340. The output of the NOR gate 340 indicates whether the TM group address 262 matches the authorized TM function corresponding to the bit compare circuit 310n. For example, when all the bits (e.g., 0 to i) match, the output of the NOR gate 340 is set to a logic high indicating a match. Of course, those skilled in the art recognize that the bit compare logic circuit is not limited to the disclosed logic structure and that other types of bit compare logic structures can be used.

In some embodiments, the number of bit compare circuits 310 corresponds to the number of authorized TM functions in the authorized TM list 185. This configuration is efficient in terms of minimizing logic area used on the memory device 100 but may require that all the authorized TM functions be known at the time of chip manufacture. An advantage of knowing which TM functions are authorized beforehand is that, because the configuration of authorized TM list 185 is fixed, simple switches (e.g., metal switches) can be used to store the information in NVM array 180 instead of relatively more logic intensive fuse latches (or anti-fuse latches).

In some embodiments, the memory device 100 can be manufactured with a predetermined number of bit compare circuits 310 even in a case where the number of authorized TM functions is not known. For example, if it is known that no more than a 100 TM functions will ever be authorized for use by a customer, the memory device 100 can be manufactured with 100 bit compare circuits 310. In some embodiments, for example when logic space is not an issue and/or if maximum test mode flexibility is required, the number of bit compare circuits 310 can equal the number of manufacturer TM functions. If, after production testing, there are more bit compare circuits 310 than authorized TM functions, the excess bit compare circuits 310 can go unused and the corresponding NVM elements in NVM array 180 will remain unprogrammed.

In some embodiments, the authorized TM functions can be dynamically determined after the chip has been manufactured and before shipment. During this time, information (e.g., address information) corresponding to the dynamically determined authorized TM functions can be programmed into the NVM array 180 (e.g., by programming fuse latches, anti-fuse latches, and/or other types of latch circuits) to generate the authorized TM list 185. By dynamically programming the authorized TM list 185, greater flexibility can be achieved in customizing the authorized TM functions to the needs of the customer. For example, the authorized TM list can be customized based on the type of customer (e.g., technology field, etc.), the chip testing sophistication of customer, the customer's applications (consumer electronics, industrial electronics, etc.), the size of customer, etc.

In some embodiments, the authorized TM list 185 can include both predetermined TM functions and dynamically determined TM functions. For example, one or more predetermined addresses (group and/or option addresses) corresponding to fixed TM functions ("fixed addresses") can be authorized for all customers (if needed), and one or more dynamically determined addresses (group and/or option addresses) corresponding to TM functions ("dynamic address") can be authorized dynamically on a customer-by-customer basis (if needed). As seen in FIG. 3A, the authorized TM list 185 in NVM array 180 can be grouped into fixed address latches 185a and dynamic address latches 185b. In some embodiments, the fixed address latches 185a can include simple switches such as, for example, metal switches, that are configured by hardwiring to a logic high or logic low source as appropriate during, for example, the initial manufacture of the memory chip. In some embodiments, the dynamic address latches 185b can include dynamically programmable latches (e.g., fuse circuits, anti-fuse circuits, DICE circuits, etc.) that can be programmed after initial manufacture and prior to shipment to the customer. To save space, the number of dynamically determined addresses should be kept to a minimum (e.g., 50% of the authorized TM addresses or fewer). In some embodiments, the customer will not have the capability to modify the authorized TM function list.

Figure 4:
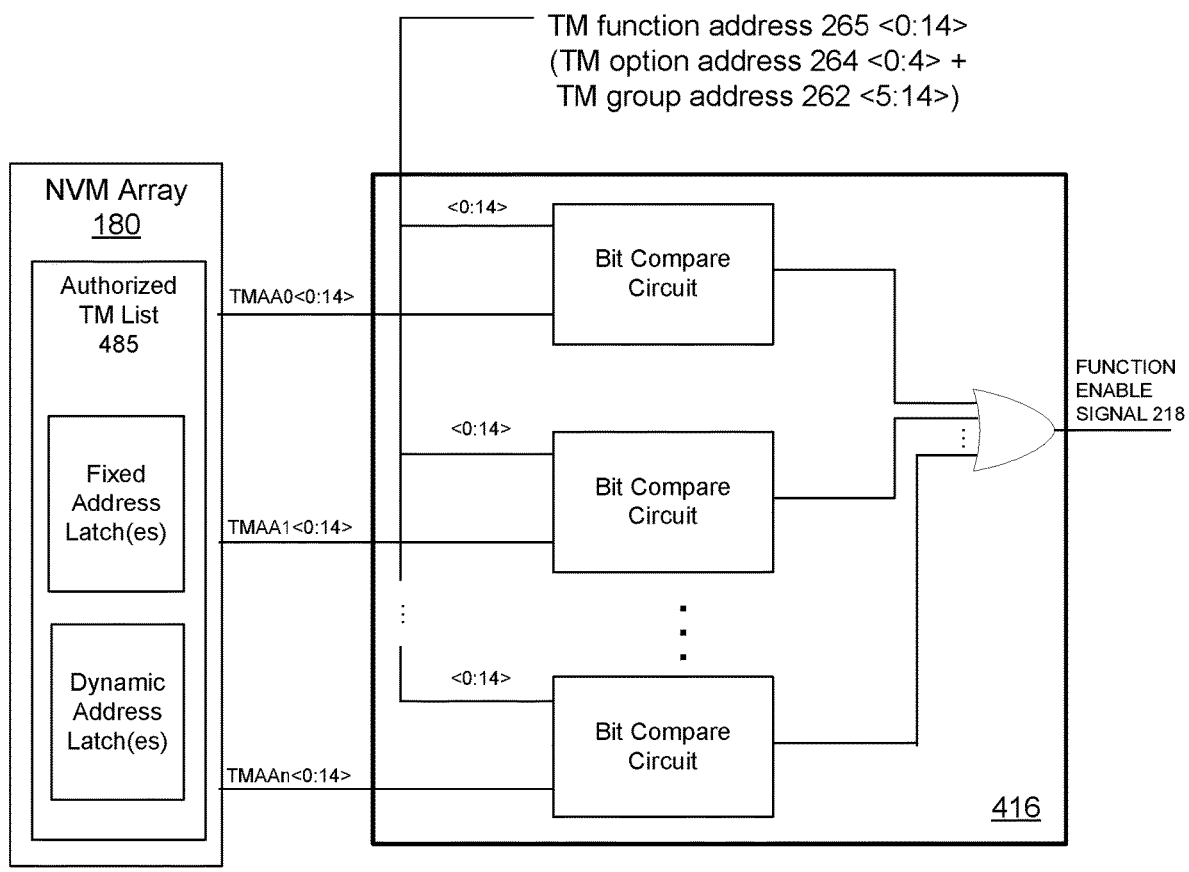
FIG. 4 is a simplified block diagram schematically illustrating a test mode compare circuit and authorized list circuit in accordance with embodiments of the present technology.

In the above exemplary embodiments, if a TM function group was verified as being an authorized TM function group, then all test options associated with that TM function group are enabled for use by the customer. However, in some cases, along with limiting the customer's access to only certain authorized TM function groups, it may be desirable to further limit the customer's access to only certain test options within an authorized TM function group. For example, a chip manufacturer may want to allow a customer to perform a read compression test but not a write compression test. Accordingly, in some exemplary embodiments, the authorized match circuit can be configured to determine if both the group address and the option address of a TM function address match the information in a stored authorized TM list. FIG. 4 illustrates an exemplary embodiment of an authorized match circuit 416 that checks both the group address and the option address of a TM function address. Those skilled in the art will recognize that authorized match circuit 416 is similar to authorized match circuit 216 and thus, for brevity, like functions are not discussed. In the embodiment of FIG. 4, the authorized match circuit 416 receives the full TM function address 265 (e.g., all 14 bits in this example), which includes the TM option address 264 (5 bits) and the TM group address 262 (9 bits). The TM function address signal 265 is provided to one input of the bit compare circuits. Similar to the bit compare circuits in the authorized match circuit 216, the other input to each of the bit compare circuits in the authorized match circuit 416 is a respective 14-bit authorized TM function address (e.g., TMAA0-n). The 14-bit authorized TM function address information can be stored in the authorized TM list 485 in NVM array 180. Those skilled in the art recognize that authorized TM list 485 is similar in function and structure to authorized TM list 185 and thus, for brevity, will not be discussed further. Similar to authorized match circuit 216, if any bit compare circuit in authorized match circuit 416 has a match, a function enable signal 218 is sent to one input of the AND gate in TM check circuit 215.

Figure 5A:
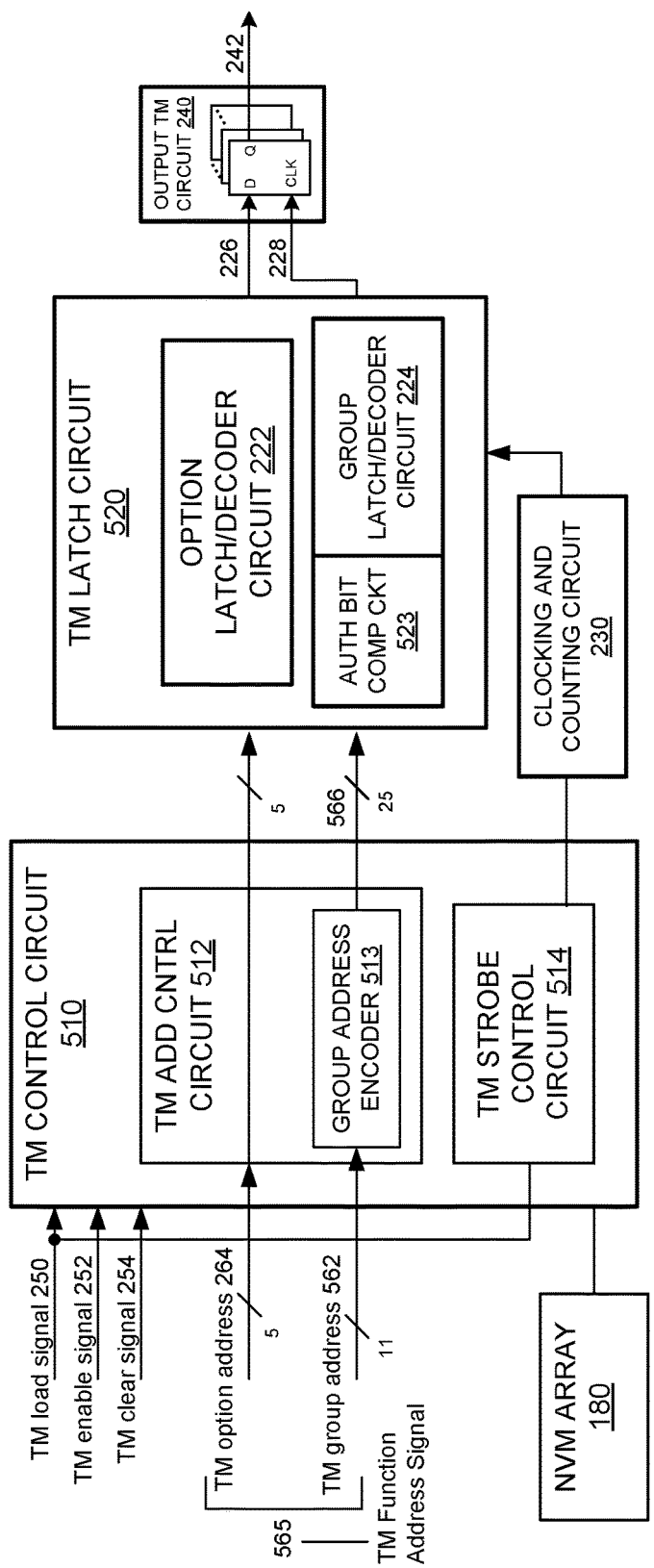
FIG. 5A is a simplified block diagram schematically illustrating a test mode control circuit in accordance with embodiments of the present technology.
Figure 5B:
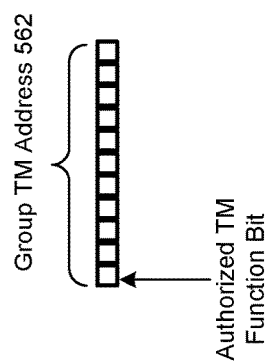
FIG. 5B is an exemplary group address format that can be used in the test mode control circuit of FIG. 5A.

FIG. 5A illustrates another embodiment of the present disclosure. Many functions in the embodiment of FIG. 5 are similar to that of FIG. 2. Thus, for brevity, similar functions are not discussed. In embodiment of FIG. 5A, the authorized TM list is not stored in the NVM 180. Instead, the authorized TM list can be incorporated into one or more bits of the TM function address such as for example, the group address and/or option address. That is, the addresses of all the manufacturer TM functions can include an identifier (e.g., one or more bits) in the group address and/or option address to indicate whether the respective TM function test is authorized for use by the customer. For example, as seen in FIG. 5B, each group TM address 562 can include an extra bit (e.g., authorized TM function bit) that identifies whether the TM function corresponding to the group is authorized for use by the customer. Accordingly, as seen in FIGS. 5A and 5B, the TM group address in this embodiment has 11 bits instead of 10 bits as in the above embodiments. In the embodiment of FIG. 5, the authorized TM list includes the group address having a bit that indicates that the group address corresponds to an authorized TM function. Of course, the number of bits (address bits and/or identification bits) are not limiting and can be different depending on the implementation.

As seen in FIG. 5A, the TM control circuit 510 can receive the TM enable signal 250 and/or the TM clear signal 254 to respectively place the memory device 100 into test mode and/or clear test mode. Based on the TM load signal 250, the TM option address 264 and the TM group address 562 can be loaded into TM address control circuit 512. Once loaded, based on strobe signals from the TM strobe control circuit 514 and the clocking and counting circuit 230, the TM option address 264 and an encoded group address 566 is loaded into TM latch circuit 520.

As seen in FIG. 5A, unlike the embodiment of FIG. 2, the TM strobe control circuit 514 does not receive an enable signal from an authorized match circuit. Instead, because the authorization information is part of the TM group address 562 (in this exemplary embodiment) the TM latch circuit 520 can include an authorization bit compare circuit 523 to determine whether the group address belongs to an authorized TM function or not. If the authorization bit in the TM group address 562 has a value indicating that the TM group address 562 is on the authorized TM list, the TM latch circuit 520 programs the latches in the option latch/decoder circuit 222 and group latch/decoder circuit 224. After the latches are programmed and enabled, the latch information in the option latch/decoder circuit 222 and group latch/decoder circuit 224 is decoded and processed as discussed above with respect to the embodiment of FIG. 2. If the authorization bit in the TM group address 562 has a value indicating that the TM group address 562 is not on the authorized TM list, the option address and/or the group address are not programed into latches and/or the decoding is not performed. When the memory device 100 is in possession of the chip manufacturer, the authorization bit (or bits) will have a value that enables all the manufacturer TM function tests. However, when the memory device 100 is shipped to the customer, only those TM function tests that are authorized to be used by the customer will have the proper value stored in the authorization bit (or bits) of the group addresses and/or the option addresses.

In the above embodiments, because the customer can only execute TM functions that are on the authorized TM function list (which can only be created by hardwiring switches and/or programming the NVM array (e.g., blowing fuses, shorting anti-fuses, etc.)), the risk of damaging the memory device through improper use and/or the chip design being reverse engineered is limited. If no authorized TM list is created, a customer will not have access to any TM functions. In some embodiments, to provide additional security, the signal sequence to enter the global test mode (e.g., signal sequence that results in the generation of the TM enable signal) and/or the sequence to enter individual TM function tests (e.g., the signal sequence that results in the degeneration of the TM function address signal) can be different from the signal sequences used by the manufacturer. Thus, the manufacturer will never have to distribute their sequence codes.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, the various embodiments described herein may also be combined to provide further embodiments. Furthermore, the above detailed descriptions of embodiments of the technology are also not intended to limit the technology to the precise application disclosed above. Instead, various components and/or functions of the technology can be implemented in other applications. For example, while embodiments of the present technology are generally described with reference to memory devices, the present technology can also be used for a number of other applications, such as those devices that can benefit from test mode functions that are typically reserved for manufacturers.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

From the foregoing, it will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. An apparatus comprising:
a first storage component to store information related to a plurality of test mode (TM) functions for testing various features of the apparatus;
a second storage component to store information indicating which TM functions of the plurality of TM functions are authorized for customer use; and
a match circuit to compare address information of a selected TM function with the stored information in the second storage component to determine whether the selected TM function has been authorized for customer use.

2. The apparatus of claim 1, further comprising:
a TM latch circuit having one or more latches, the TM latch circuit loading the selected address information into the one or more latches based on the match circuit determining that the selected TM function is authorized,
wherein the TM latch circuit decodes the one or more latches and outputs a test mode signal to turn on test mode operations in circuits associated with the selected TM function.

3. The apparatus of claim 1, wherein the second storage component includes an array of nonvolatile memory elements.

4. The apparatus of claim 3, wherein the stored information in the second storage component includes group address information of authorized TM functions.

5. The apparatus of claim 4, wherein the stored information in the second storage component further includes option address information of authorized TM functions.

6. The apparatus of claim 3, wherein the array of nonvolatile memory elements includes fixed address latches that include metal switches.

7. The apparatus of claim 3, wherein the array of nonvolatile memory elements includes dynamic address latches that include programmable fuse circuits.

8. The apparatus of claim 1, wherein each TM function of the plurality of TM functions includes an address having at least one bit that indicates whether the respective TM function of the plurality of TM functions has been authorized for customer use, and
wherein the second storage component comprises addresses of TM functions in which the at least one bit indicates that the respective TM function is authorized for customer use.

9. The apparatus of claim 8, wherein the stored information in the second storage component is associated with group address information of authorized TM functions.

10. The apparatus of claim 9, wherein the stored information in the second storage component is further associated with option address information of authorized TM functions.

11. The apparatus of claim 8, wherein the addresses of TM functions that are authorized for customer use are stored in nonvolatile memory elements that include fixed address latches with metal switches.

12. The apparatus of claim 8, wherein the addresses of TM functions that are authorized for customer use are stored in nonvolatile memory elements that include dynamic address latches with programmable fuse circuits.

13. A method comprising:
receiving address information corresponding to a TM function to be performed in a memory device;
comparing the address information corresponding to the TM function with an authorized TM list stored in the memory device to determine if there is a match;
if the comparison indicates a match, outputting a latch load signal pulse;
programming one or more latches in the memory device based on the address information corresponding to the TM function and based on the latch load signal pulse;
decoding information in the one or more latches; and outputting a test mode signal to turn on test mode operations in circuits associated with the TM function based on the decoded information, wherein the memory device includes a plurality of TM functions for testing various features of the memory device and the authorized TM list identifies which of the plurality of TM functions has been authorized for customer use.

14. The method of claim 13, wherein the authorized TM list is stored in an array of nonvolatile memory elements.

15. The method of claim 14, wherein the authorized TM list includes group address information of authorized TM functions.

16. The method of claim 15, wherein the authorized TM list further includes option address information of the authorized TM functions.

17. The method of claim 14, wherein the array of nonvolatile memory elements includes fixed address latches that include metal switches.

18. The method of claim 14, wherein the array of nonvolatile memory elements includes dynamic address latches that include programmable fuse circuits.

19. An apparatus comprising:
a test mode (TM) control circuit that is configured to,
receive address information corresponding to a TM function to be performed in the apparatus,
compare the address information corresponding to the TM function with an authorized TM list stored in a memory of the apparatus to determine if there is a match, and
if the comparison indicates a match, output a latch load signal pulse; and
a TM latch circuit having one or more latches, the TM latch circuit configured to,
program the one or more latches based on the address information corresponding to the TM function and based on the latch load signal pulse, and
decode information in the one or more latches, and
output a test mode signal to turn on test mode operations in circuits associated with the TM function based on the decoded information,
wherein the apparatus includes a plurality of TM functions for testing various features of the apparatus and the authorized TM list identifies which of the plurality of TM functions has been authorized for customer use.

20. The apparatus of claim 19, wherein the authorized TM list is stored in an array of nonvolatile memory elements.

* * * * *